United States Patent
Sahm et al.

(10) Patent No.: US 11,688,989 B2
(45) Date of Patent: Jun. 27, 2023

(54) COMPONENT, POSITIONING DEVICE AND METHOD FOR FASTENING THE COMPONENT BY SOLDERING

(71) Applicant: PHOENIX CONTACT GmbH & Co. KG, Blomberg (DE)

(72) Inventors: Jurgen Sahm, Ammerbuch (DE); Ulrich Rosemeyer, Schieder Schwalenberg (DE)

(73) Assignee: PHOENIX CONTACT GmbH & Co., Blomberg (DE)

( * ) Notice: Subject to any disclaimer, the term of this patent is extended or adjusted under 35 U.S.C. 154(b) by 322 days.

(21) Appl. No.: 16/332,774

(22) PCT Filed: Sep. 26, 2017

(86) PCT No.: PCT/DE2017/100822
§ 371 (c)(1),
(2) Date: Mar. 12, 2019

(87) PCT Pub. No.: WO2018/059625
PCT Pub. Date: Apr. 5, 2018

(65) Prior Publication Data
US 2019/0363500 A1    Nov. 28, 2019

(30) Foreign Application Priority Data
Sep. 29, 2016 (DE) ............. 10 2016 118 527.2

(51) Int. Cl.
*B23K 1/00* (2006.01)
*H05K 3/34* (2006.01)
(Continued)

(52) U.S. Cl.
CPC ....... *H01R 43/0263* (2013.01); *B23K 1/0016* (2013.01); *B23K 3/087* (2013.01);
(Continued)

(58) Field of Classification Search
None
See application file for complete search history.

(56) References Cited

U.S. PATENT DOCUMENTS 5,785,546 A * 7/1998 Hamai ............... H01R 13/6272
439/354
6,261,128 B1 7/2001 Heim
(Continued)

FOREIGN PATENT DOCUMENTS

DE          100 21 396 A1   12/2000
DE    10 2008 029 123 A1   12/2009
(Continued)

OTHER PUBLICATIONS

International Search Report for corresponding App. No. PCT/DE2017/100822, dated Jan. 23, 2018.
(Continued)

*Primary Examiner* — Devang R Patel
(74) *Attorney, Agent, or Firm* — Renner, Otto, Boisselle & Sklar, LLP

(57) ABSTRACT

A component having electrical connector elements for making contact with a circuit board, optionally having additional securing elements for mechanical stability after soldering or positioning devices for supporting components with an unfavourable center of gravity or supporting elements which can optionally be removed after the soldering process. The positioning devices or supporting elements serve to position components with different forms on a circuit board and to keep them in the correct orientation for the soldering process. Fitting takes place in a force-free manner and thus favours automation and the use of for example pick-and-place robots which take hold of and move the particular component via the positioning device connected thereto, engaging with and/or around either a contact element or a supporting element. The support of the positioning device
(Continued)

allows a stable state during the soldering process. In a corresponding manner, methods for carrying out the soldering processes are specified.

10 Claims, 3 Drawing Sheets

(51) Int. Cl.
    *H01R 43/02*          (2006.01)
    *B23K 3/08*           (2006.01)
    *H01R 12/58*          (2011.01)
    *H01R 12/70*          (2011.01)
    *H01R 13/50*          (2006.01)
    *B23K 101/42*        (2006.01)

(52) U.S. Cl.
    CPC ........... *H01R 12/58* (2013.01); *H01R 12/707* (2013.01); *H01R 13/501* (2013.01); *H01R 43/0256* (2013.01); *H05K 3/3447* (2013.01); *B23K 2101/42* (2018.08); *H05K 2201/09063* (2013.01); *H05K 2201/10189* (2013.01); *H05K 2203/0182* (2013.01)

(56) References Cited

U.S. PATENT DOCUMENTS

| | | | |
|---|---|---|---|
| 6,923,678 B2* | 8/2005 | Kato | H05K 3/301 439/567 |
| 7,500,872 B2* | 3/2009 | Takahashi | H01R 12/7029 439/567 |
| 7,561,442 B2* | 7/2009 | Fukumoto | H05K 3/301 174/138 G |
| 7,963,787 B2* | 6/2011 | Demonica | H01R 13/50 439/326 |
| 2001/0045009 A1* | 11/2001 | Cachina | H01R 43/0256 29/840 |
| 2004/0053529 A1 | 3/2004 | Kato | |
| 2005/0003704 A1* | 1/2005 | Kasahara | H01R 12/707 439/567 |
| 2006/0068618 A1* | 3/2006 | Li | H01R 43/0263 439/79 |
| 2009/0068864 A1* | 3/2009 | Honda | H05K 1/116 439/83 |
| 2009/0305556 A1* | 12/2009 | Kawahara | H01R 12/7029 439/544 |
| 2010/0165590 A1 | 7/2010 | Ishizaki | |
| 2011/0299262 A1* | 12/2011 | Crotty | H01R 13/6271 361/818 |
| 2012/0127681 A1* | 5/2012 | Ryu | H05K 3/306 361/772 |
| 2014/0085841 A1* | 3/2014 | Fukumoto | H05K 3/3447 361/760 |
| 2014/0317917 A1 | 10/2014 | Gobeil | |

FOREIGN PATENT DOCUMENTS

JP           H06 283222 A     10/1994
WO         97/17823 A1      5/1997

OTHER PUBLICATIONS

Search Report for corresponding German App. No. 10 2016 118 527.2 (date unknown).

* cited by examiner

COMPONENT, POSITIONING DEVICE AND METHOD FOR FASTENING THE COMPONENT BY SOLDERING

TECHNICAL FIELD

The invention relates to components having electrical connection elements for making contact with a printed circuit board, and to a positioning device for fastening a component by soldering, and also to methods for fastening a component on the printed circuit board by soldering. Here, the invention refers, in particular, to mounting components on printed circuit boards and the positioning of said components before they are soldered to the printed circuit board.

DISCUSSION OF RELATED ART

DE 10 2008 029 123 A1 discloses an arrangement and a method for fastening a component on a printed circuit board by soldering. Here, a holder, which is manufactured in one piece, has a mounting element and also spacers which are fastened to said mounting element and serve to fix the holder on the printed circuit board. Owing to the flexible suspension of the spacers from the mounting element, the spacers are located in the plane which is defined by the mounting element in the premounted state, wherein the spacers are angled for mounting the holder on the printed circuit board.

Furthermore, DE 100 21 396 A1 discloses an apparatus for holding a module on a printed circuit board, which apparatus has a holding element, which protrudes out of the plane of the printed circuit board and is fitted to the printed circuit board, and an adapter element which has a recess for receiving the module, wherein the holding element is designed such that the adapter element can be inserted into the holding element in the horizontal direction and, after coupling to the holding element, is largely enclosed by said holding element.

SUMMARY OF THE INVENTION

The components to which the invention relates are, for example, electrical plug-in connectors or other electrical/electromechanical components which are to be fastened on a printed circuit board and, to this end, have at least electrical connection elements which are usually inserted into corresponding bores in the printed circuit board and are soldered to said printed circuit board. It is known to design electrical components which change their position after being placed on the printed circuit board on account of their center of gravity or components which, on account of their size or mechanical actions, after soldering, such as for example connection of a plug-in connector, for stabilizing with additional latching hooks for fastening on the printed circuit board. These are economically suitable for industrial soldering processes, substantially only for wave soldering processes, since, when the printed circuit board is fitted with the electronic/electromechanical components, large forces take effect in order to deflect the latching hooks of the components and to allow said latching hooks to engage into the capturing bores of the printed circuit board. The vibrations which act on the printed circuit board when the latching hooks are fixed can furthermore also displace other surface-mounted components (SMD-BE) out of their fitting position. Therefore, the known solutions are not suitable for automated fitting. However, there is an increasing requirement to solder printed circuit boards which are populated in this way, especially also for reflow processes.

The invention is based on the object of improving the abovementioned prior art and proposing options which allow the printed circuit board to be fitted with electronic/electromechanical components which either still absorb mechanical forces after soldering and/or have to be held in a stable position during fitting.

According to the invention, this object is achieved by a component having the features described herein, a positioning device as described herein, and the methods described herein.

Accordingly, the component has a positioning device which has at least one support for releasably supporting the positioning device on the printed circuit board and at least one holding element which can be releasably connected to the component and which, when the component is mounted on a printed circuit board, can be arranged such that it holds the component. The positioning device therefore consists of a holding element which is configured such that it can be releasably connected to the component in order to assist the component in a suitable manner when said component is mounted on the printed circuit board so that said component is held in its position until the soldering takes place. This occurs, in particular, in the case of top-heavy components, that is to say components which have a center of gravity which, after the component is positioned, leads to tilting of said component and therefore also the electrical connections in the contact bores of the printed circuit board change. Assistance by virtue of the holding element can take place in accordance with the configuration of the component and the respective application. The holding element can therefore be designed such that, in accordance with the component to be assisted which has, for example, a plug-in connector, it engages into the plug-in connector, for example into the socket, or corresponding openings for the plug pins. It is equally possible for the holding element to encompass, engage beneath or in some other way provide assistance to the component at the end side with or without a plug-in connector. The component can additionally have further supporting elements which are not fitted at the end side but rather on the side and with which the holding element of the positioning device can engage. In addition to the holding element, the positioning device has a support for releasably supporting the positioning device on the printed circuit board. The position of the positioning device is held by means of the support on account of being supported on the printed circuit board by means of the weight which acts in the perpendicular direction in relation to the surface of the printed circuit board, as a result of which a structural part of a component, which structural part is releasably connected to the holding element of the positioning device, can no longer be deflected and/or displaced. In the case of components which are located at the edge of the printed circuit boards, it is also possible for the positioning device to be supported on the adjacent printed circuit board. The positioning device is removed after the component is soldered to the printed circuit board.

In a preferred embodiment, the component additionally has at least one supporting element which is directed toward the outside and is preferably detachably connected to the component. Separating elements of this kind are preferably arranged on the side of the component, for example a plug-in connector. The connection lines are located on the rear side of the plug-in connector and the mating plug can be inserted at the end side. For components with an unfavorable center of gravity, that is to say those which, on account of their design-related weight distribution, cannot maintain the position and orientation intended on the printed circuit board in the unsoldered state without external actions, the position of the at least one supporting element on the component is such that the component can be securely held in the prespecified position by the holding element. To this end, the at least one supporting element can be formed on each structural part of the component such that it either projects laterally from the component as an arm or wing or else is angled in the direction of the printed circuit board. In the first case, assistance is provided by the positioning device, while in the second case the support arrangement stands directly on the printed circuit board. When the component is guided by means of the positioning device which is preferably detachably connected to the supporting element, said positioning device is detached from the supporting element again and removed after the soldering process. Releasably fastening the at least one supporting element on the component, for example by breaking off, serves either for removal of the supporting element after the soldering process for the purpose of optimizing the grouping of structural parts on the limited surface area of a printed circuit board or else for removal when the support is provided exclusively by means of the positioning device at the end side, such as in the case of a plug-in connector for example. In this case, into the support arrangement is not required.

The holding element is expediently designed in such a way that it at least partially encompasses a contact element, which is located on the component, in the connected state and/or engages into the contact element or at least partially encompasses the at least one supporting element. The component itself can also be the contact element in this case. In accordance with the design of the contact element as a socket or plug, the shape of the holding element is formed such that a releasable connection can be realized by feeding the holding element to the contact element from at least one movement direction and, at the same time, a stable supporting position is ensured preferably at least in the direction of the printed circuit board. This can take place, for example, by configuration with corresponding pole patterns as plug or socket or simply as a holding element which engages beneath the component or an encompassing holding element. The possible additional action surface provided by the supporting element allows the component to be held in the prespecified position for the soldering process by means of the holding element.

According to a further preferred refinement of the component, said component has at least one fixing element for mechanically fixing the printed circuit board to a shaft having at least one latching means which acts in the axial direction. The fixing element can have different refinements, wherein it is essential that it has a widened portion, for example in the form of a latching hook, a narrowed portion in the form of a constriction in the shaft, a thread or, for example when designed in the form of an eyelet, an opening into which solder can enter so the a movement in the axial direction is no longer possible and consequently the component is additionally mechanically fixed on the printed circuit board. This is important particularly in the case of relatively large or self-supporting components in order to not mechanically load the solder connections for the electrical connections or to do so to the smallest possible extent. It is particularly advantageous for the fixing element to not have to be formed from metal and for fixing in a correspondingly large capturing bore in the printed circuit board to nevertheless be possible. Therefore, a fixing element composed of plastic is particularly preferred. The capturing bore is preferably metallized. In this context, it is also very important for the fixing element to be able to be inserted into the capturing bore without force because said capturing bore has a sufficient diameter. Therefore, when a component of this kind is put into place, there is no longer the risk of other components which are already located on the printed circuit board being moved out of their position due to vibration.

The object is also achieved by a component that has at least one supporting element which is preferably releasably connected to the component and serves at least to temporarily support the component when it is mounted on a printed circuit board. A supporting element of this kind has already been discussed above in connection with the positioning device but can also be realized without said positioning device in a component.

The object is further achieved by a positioning device for fastening a component on a printed circuit board by soldering, which component has at least one support for releasably supporting the positioning device on the printed circuit board and at least one holding element which can be releasably connected to the component and, when the component is mounted on the printed circuit board, can be arranged such that it holds the component on the printed circuit board by way of the support. Here, the holding element can be designed, for example, such that it corresponds in a complementary manner to a pole pattern of a plug contact or simply encompasses the component or only engages beneath the component and therefore provides support.

The positioning device preferably has at least one holding element which is designed in such a way that it at least partially encompasses a contact element or a supporting element which is located on the component and/or engages into the contact element. In the case of a large number of different components, a suitable holding element is preferably individually adjusted, which holding element either can be used for a family of similar components on account of its partially encompassing and/or engaging formations or is designed with complete encompassing and/or engagement in a complementary manner in relation to the contact element of the component, so that an optimum releasable connection between the holding element and the contact element is established. On account of the position of the alternative at least one supporting element, a releasable connection between the printed circuit board and the component is established, said connection displacing the previously unfavorably positioned center of gravity of the component and establishing a compensated weight distribution. As a result, it is possible, solely by way of the weight of the component, which weight is directed onto the printed circuit board, to maintain the relative position of said component and printed circuit board with respect to one another. Therefore, for example, existing device plug-in connectors through to individual contacts can be fitted as angled variants in printed circuit boards in an automated manner and, for example, soldered using a reflow process.

The method for fastening, by soldering, a component with an unfavorable center of gravity during mounting having one or more of the abovementioned features without a fixing element provides the following steps:

providing a printed circuit board having contact bores;
arranging the component on the printed circuit board with the electrical connection elements in the contact bores;
releasably arranging, in a manner supporting the component, the at least one holding element of the positioning device on the printed circuit board, wherein the holding element at least partially encompasses the contact element or the supporting element and/or engages into the contact element;

filling the at least one contact bore with a liquid soldering material and solidifying the soldering material; or melting and solidifying a soldering material which is already located in the at least one contact bore; and removing the positioning device.

The method takes into account production both using a wave soldering process and also using a reflow process.

The feature melting and solidifying also applies in the case of use of a conductive adhesive.

According to a further preferred embodiment of the method with a component having an additional fixing element for mechanically fixing the component to the printed circuit board, the following steps can be provided:

additionally providing at least one, preferably metallized, capturing bore in the printed circuit board, wherein the at least one capturing bore at least has a diameter which is larger than the cross section of the fixing element, so that the fixing element can be inserted into the capturing bore without force;

filling the at least one contact bore and the at least one capturing bore with a liquid soldering material and solidifying the soldering material; or melting and solidifying a soldering material which is already located in the at least one contact bore and the at least one capturing bore.

The enlarged diameter, compared with the usual procedures, of the preferably metallized capturing bore ensures force-free insertion of the respective fixing element without rendering deflection, for example, of a latching hook, which is located on the fixing element, as a latching means necessary. An arrangement of the capturing bore in a manner slightly offset in relation to the fixing element is likewise a possible configuration for fitting the printed circuit board with the component without force. The requirement of capturing bores with a sufficiently large diameter for receiving, for example, in each case one latching hook without tipping or exerting shear forces allows positioning of the components on the printed circuit board with linear movement sequences with respect to the movement direction without any tilting of the components in relation to one another. This is advantageous for use, for example, of a pick-and-place robot and therefore automation in populating printed circuit boards. In the described arrangement, the positioning device releasably rests on the printed circuit board by way of at least one support. The position of the positioning device is therefore held on account of being supported on the printed circuit board, as a result of which a structural part of a component, which structural part engages into the holding element of the positioning device and/or encompasses the holding element, that is to say either a contact element or a supporting element, can no longer be deflected and/or displaced by means of a force which acts in the perpendicular direction in relation to the surface of the printed circuit board. Furthermore, when the component is positioned on the edge of the printed circuit board, the component can be supported against the neighboring printed circuit board and held in the correct soldering position. Filling the space which is delimited by the shaft of the at least one fixing element and the periphery of the at least one capturing bore of the printed circuit board with a thermoplastic, electrically conductive releasable material (solder) takes place in a positive fashion. Owing to the metal-coated inner sides of the capturing bores, the solder is drawn, for example using a reflow soldering process, into the capturing bore due to the capillary effect and in this way surrounds the shaft of the fixing element. This creates positive fixing comparable to latching of a latching hook into the printed circuit board, so that the mechanical fixing of the component is still ensured after the soldering process. The same applies when, for example, a constriction or an eyelet is used, in the case of which the solder through the opening of the eyelet firmly holds the fixing element. To this end, it is not necessary for the fixing element to be metallic in the region in which the solder closes the capturing bore. The fixing element is preferably composed of plastic. After the soldered material has solidified, the plug-in fastening of the at least one holding element of the positioning device to the at least one contact element or the supporting element is released from the component. Owing to the complete soldering of the component, both to the fixing element and also to the electrical connection elements, and curing of the solder, additional anchoring is produced in comparison to conventionally soldered electrical units with an unfavorable center of gravity, especially at the latching means, in order to obtain a high degree of mechanical stability.

In the case of components in which the center of gravity of the component allows a stable soldering position during the process even without a positioning device, but mechanical fixing of the component to the printed circuit board is required, the method for fastening, by soldering, a component having at least one fixing element which has a shaft having at least one latching means which acts in the axial direction, provides the following steps:

providing a printed circuit board having contact bores and at least one capturing bore, wherein the at least one capturing bore at least has a diameter which is larger than the cross section of the fixing element, so that the fixing element can be inserted into the capturing bore without force;

arranging the component on the printed circuit board with the electrical connection elements in the contact bores and the at least one latching means of the fixing element of the component in the at least one capturing bore of the printed circuit board without force, so that the latching means of the fixing element is positioned in the capturing bore or through the capturing bore;

filling the at least one contact bore and the at least one capturing bore with a liquid soldering material and solidifying the soldering material; or melting and solidifying a soldering material which is already located in the at least one contact bore and the at least one capturing bore.

The positioning of the latching means of the fixing element in the capturing bore depends on the configuration of the latching means. In the case of, for example, a latching hook, said latching hook is guided completely through the capturing bore whereas, in the case of a constriction or, for example, in the case of an eyelet, the latching means is inserted into the capturing bore to such an extent that the solder enters the insertion or the opening of the eyelet. A corresponding behavior is also observed, for example, in the case of a thread or another technically suitable configuration which forms an axial resistance. The significance of this refinement of the invention has already been explained above in connection with other combinations.

The described method can preferably be further combined with the arrangement of a positioning device and or supporting elements if this is required. The individual steps have already been described above in another context.

The present invention allows components with different formations to be positioned on a printed circuit board with linear movement sequences and to be held with the correct orientation for the soldering process. The fitting takes place without force and is therefore advantageous for automation and the use of, for example, pick-and-place robots which act on and move the respective component by means of the positioning device which is connected to it and is located either on a contact element or on a supporting element in an engaging and/or encompassing manner. The support of the positioning device allows secure standing during the soldering process, such as, for example, in a reflow process and in a wave soldering process. It is also possible to work with conductive adhesive. After the soldering points have solidified, the positioning device, and also parts of the components which are non-functional in respect of electronic operation, such as the supporting element, can be easily removed on account of the releasable connection.

BRIEF DESCRIPTION OF THE DRAWINGS

The invention is explained in more detail with reference to exemplary embodiments which are illustrated in the drawings. Further features can be found in the following description of the exemplary embodiments of the invention in conjunction with the claims and the appended drawings. The individual features of the invention can be implemented on their own or severally in different embodiments invention. In the drawings.

DETAILED DESCRIPTION OF THE INVENTION

Figure 1:
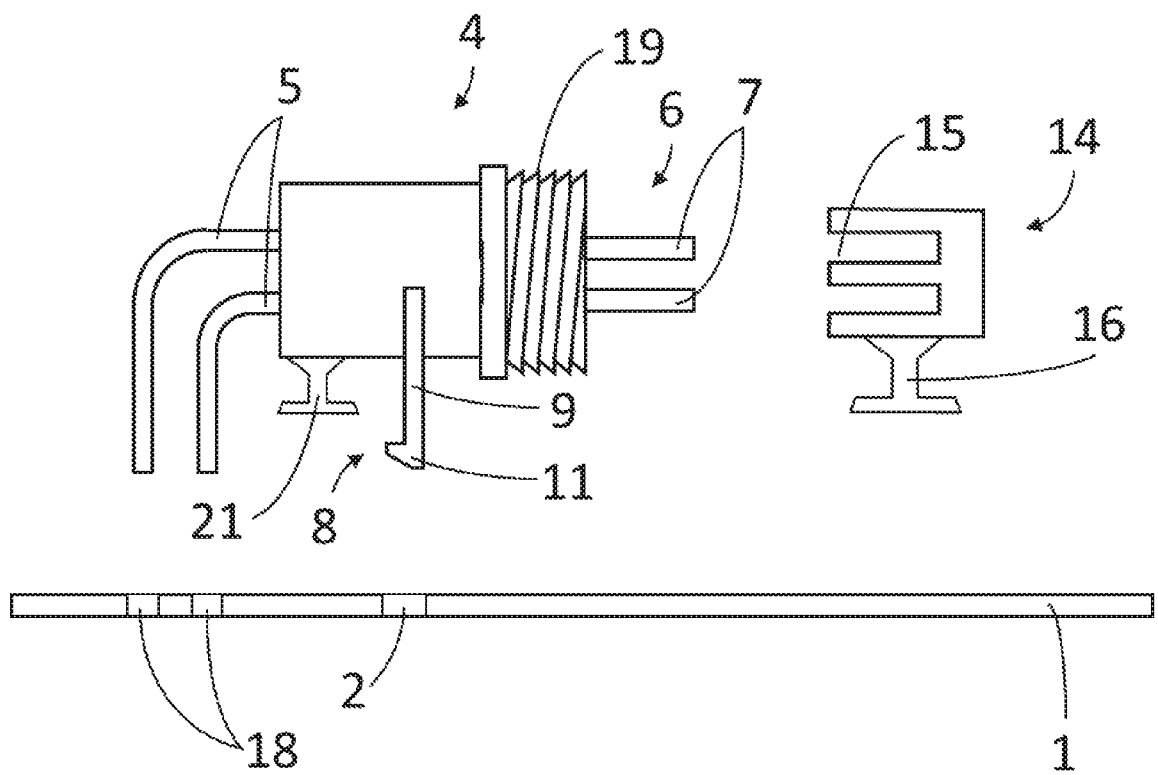
FIG. 1 shows a schematic illustration of a component, a positioning device and a printed circuit board before mounting.

The exemplary embodiment illustrated in FIG. 1 shows the schematic design, in a side view, of the components involved according to the invention, comprising a printed circuit board 1, a component 4 and a positioning device 14. The printed circuit board 1 has a plurality of bores 2, 18 which are oriented in relation to one another such that they can all receive connection elements 5 to be soldered and all fixing elements 8 of a component 4 at the same time. At least one component support arrangement 21 is usually provided in the vicinity of the connection elements 5. The bores 2, 18 have different diameters depending on what is intended to be received, as a result of which the capturing bores 2, illustrated here, for receiving the fixing element 8 are distinguished from the contact bores 18, for receiving the connection elements 5, by virtue of an enlarged diameter. The component 4 comprises the arrangement consisting of electrical connection elements 5, the at least one fixing element 8, wherein said fixing element has a shaft 9 and a latching hook 11 which adjoins the shaft 9, for example a screw thread 19 for receiving a device plug-in connector, not illustrated here, and an electrical contact element 6 having electrical contacts 7. In this schematic illustration, the contact element 6 is designed as a two-pole plug owing to the shown arrangement of the electrical contacts 7. The positioning device 14 comprises a support 16 by way of which the positioning device 14 can be placed in a stationary manner on the printed circuit board 1, and also a holding element 15 that is designed in a complementary manner in relation to the two-pole plug arrangement of the electrical contact element 6.

Figure 2:
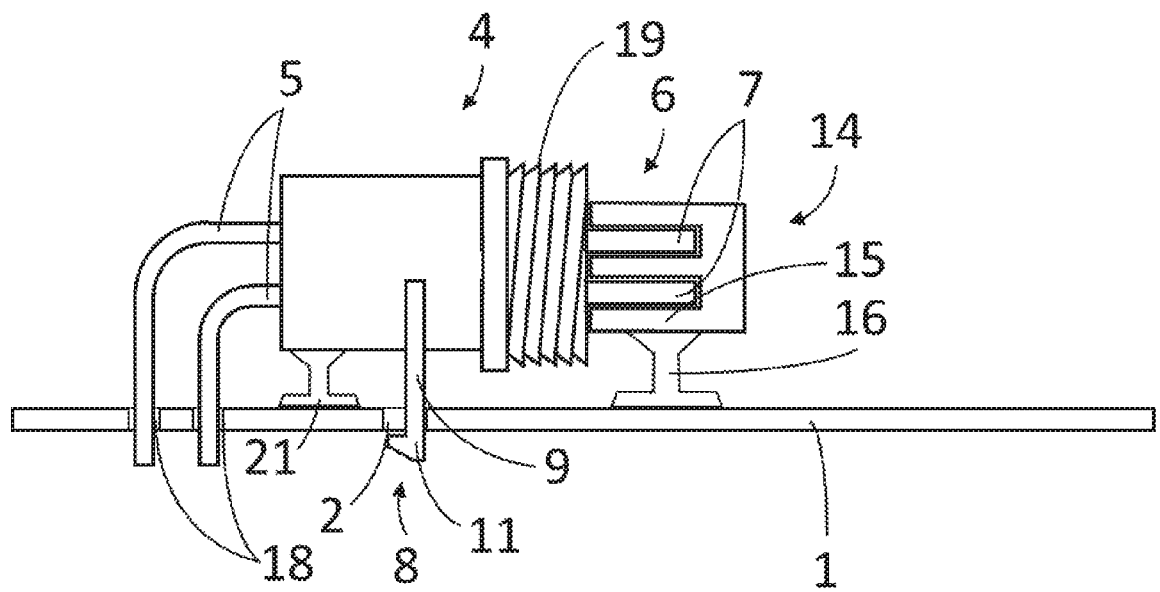
FIG. 2 shows a schematic illustration of the component, the positioning device and the printed circuit board in the state in which they are mounted on the printed circuit board.

FIG. 2 shows a schematic illustration of the expedient arrangement of the structural parts presented in FIG. 1. The component 4 is oriented in relation to the printed circuit board 1 in such a way that its longitudinal extent runs parallel in relation to the surface of the printed circuit board 1 and, at the same time, firstly the electrical connection elements 5 are received in the contact bores 18 and secondly the fixing element 8 is received in the capturing bore 2. The fixing element 8 is guided through the capturing bore 2 to such an extent that the latching hook 11 is preferably located completely below that surface of the printed circuit board 1 which is averted from the component 4 and the shaft 9 is surrounded by the capturing bore 2. The positioning device 14 is positioned in a stationary manner on the printed circuit board 1 by means of the support 16 and encompasses the electrical contacts 7 of the contact element 6 of the component 4 in a complementary manner by means of the holding element 15.

Figure 3:
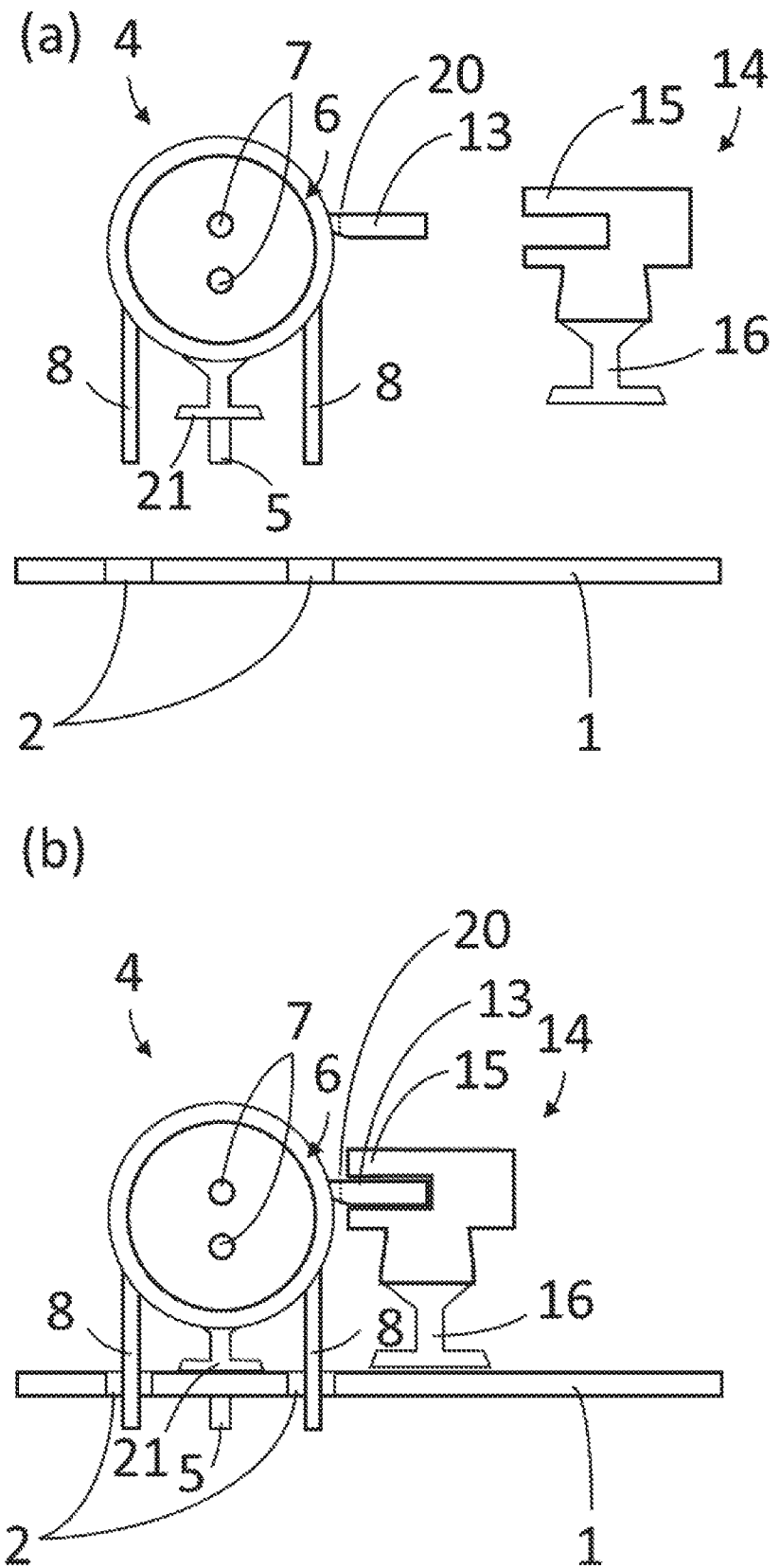
FIG. 3 shows a schematic illustration of a preferred embodiment of the component having the supporting element, the positioning device and the printed circuit board and also the arrangement thereof before mounting (FIG. 3(a)) and in the mounted state (FIG. 3(b))

Analogously to FIGS. 1 and 2, FIG. 3 shows a further exemplary embodiment in the form of a schematic illustration of a front view of the parts of the component 4 which are involved according to the invention (FIG. 3(a)) and the arrangement thereof (FIG. 3(b)). In this embodiment, a supporting element 13 is formed on the component 4, which supporting element is releasably connected to the component 4 by means of a predetermined breaking fold 20. In the arrangement in FIG. 3(b), the positioning device 14 is positioned in a stationary manner on the printed circuit board 1 by means of the support 16 and encompasses the component 4 in a complementary manner to the supporting element 3 by means of the holding element 15, so that the component 4 can be held in a stable manner in the correct soldering position for the soldering process. According to another exemplary embodiment, not illustrated, the supporting element 13 can be angled and as a result be self-supported on the printed circuit board 1 without a positioning device 14. Depending on requirements, the respective supporting element 13 can be broken after the soldering process is complete. The number of supporting elements 13, in particular the self-supporting supporting elements 13 (not illustrated), is arbitrary.

Figure 4:
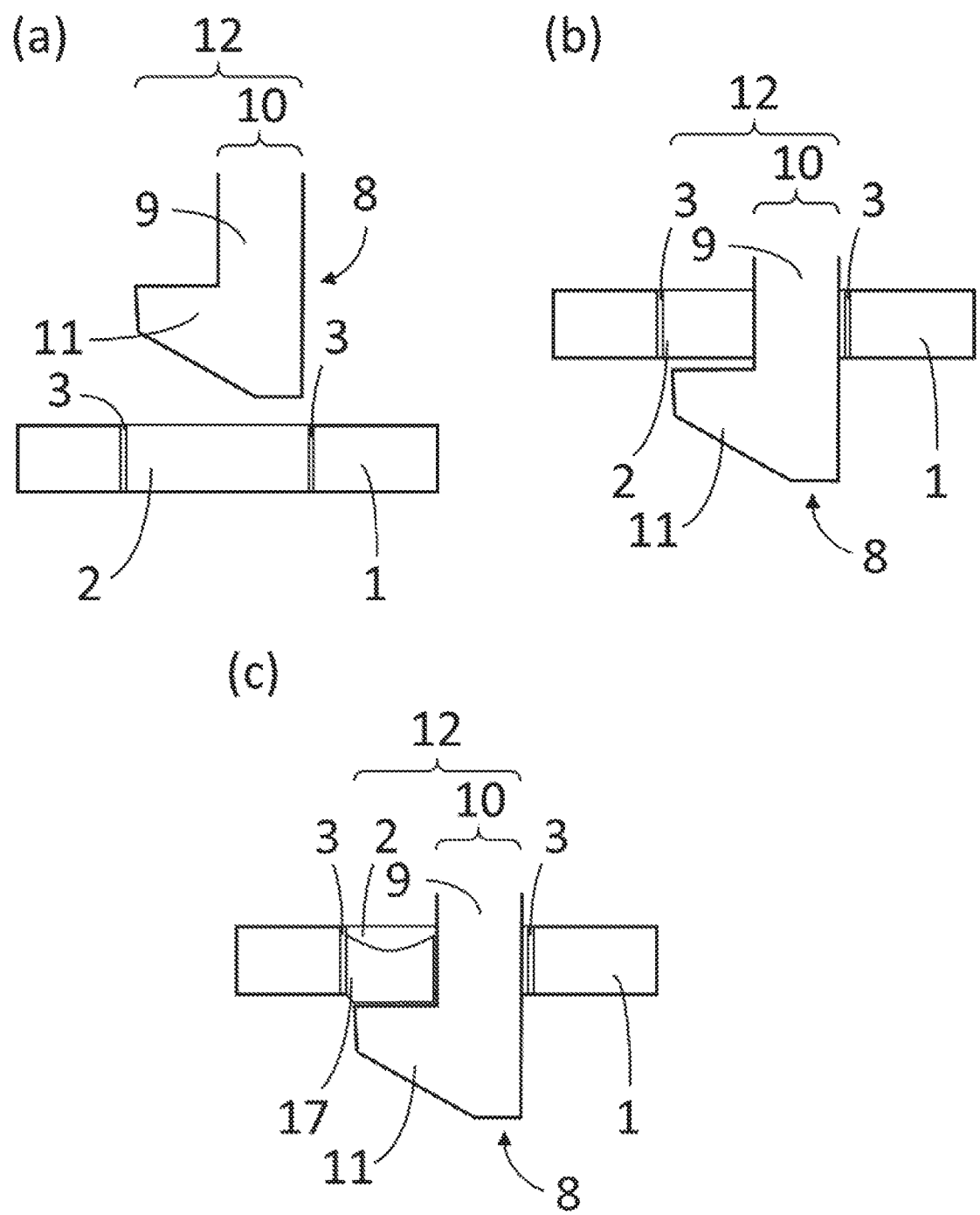
FIG. 4 shows the individual method steps for fastening the fixing element to the printed circuit board by soldering.

FIG. 4 shows a view of a detail of the fixing elements 8 illustrated in FIGS. 1-3 and represents the method steps for fastening the fixing element 8 to the printed circuit board 1 by soldering in the sequence of FIG. 4(a) to FIG. 4(c). For the purpose of populating the printed circuit board 1, the component 4 is guided, by way of the shaft 9 which is located on the fixing element 8 and the latching hook 11 which adjoins the shaft 9, through the capturing bore 2. The diameter of the capturing bore 2 is selected to be large enough that the latching hook 11 with the latching cross section 12 can be guided through the capturing bore 2 from FIG. 4(a) to FIG. 4(b) without force and is positioned directly below the printed circuit board 2. As a result, the capturing bore 2 in FIG. 4(b) surrounds the shaft 9 with a shaft cross section 10 and therefore forms a cavity which is delimited by the capturing bore 2, which is provided with a metal coating 3, and the shaft 9 which is additionally delimited at the bottom by the latching hook 11. In FIG. 4(c), this cavity is filled with soldering material 17 in such a way that, owing to the metal-coated 3 inner sides of the capturing bore 2, the solder 17 is drawn into the capturing bore 2 due to, for example, a capillary effect and in this way surrounds the shaft 9 of the fixing element 8.

The invention claimed is:

1. A method for fastening a component by soldering on a printed circuit board, the component having electrical connection elements for making contact with the printed circuit board and at least one fixing element that is formed of plastic and has a shaft which extends in an axial direction and at least one latch element on the shaft, comprising a positioning device which has at least one support for releasably supporting the positioning device on the printed circuit board and at least one holding element which can be releasably connected to the component and which, when the component is mounted on the printed circuit board, can be arranged such that it holds the component, the method comprising:

provid ing the printed circuit board having at least one contact bore and at least one, metallized, capturing bore, wherein the at least one capturing bore at least has a diameter which is larger than an outermost cross section of the fixing element, so that the shaft of the fixing element while extending in the axial direction perpendicular to the printed circuit board can be inserted into the at least one capturing bore without force;

arranging the component on the printed circuit board with electrical connection elements in the at least one contact bore;

releasably arranging, in a manner supporting the component, the at least one holding element of the positioning device on the printed circuit board, wherein the holding element at least partially encompasses a contact element or a supporting element and/or engages into the contact element;

filling the at least one contact bore and, while the shaft of the fixing element remains extending in the axial direction perpendicular to the printed circuit board and the at least one latch element on the shaft extends completely through the at least one capturing bore such that the at least one latch element is located completely below the surface of the printed circuit board, the at least one capturing bore with a liquid soldering material and solidifying the liquid soldering material, or melting and solidifying a soldering material which is already located in the at least one contact bore and, while the shaft of the fixing element remains extending in the axial direction perpendicular to the printed circuit board and the at least one latch element on the shaft extends completely through the at least one capturing bore, the at least one capturing bore, wherein the soldering material being solidified surrounds at least a portion of the fixing element within the at least one capturing bore to provide a mechanical connection of the fixing element to the printed circuit board, the at least one latch element in combination with the solidified soldering material resisting subsequent movement of the shaft in the axial direction; and removing the positioning device.

2. The method as claimed in claim 1, wherein the at least one supporting element is removed after the soldering material has solidified.

3. A method for fastening, by soldering, a component having electrical connection elements for making contact with a printed circuit board and at least one fixing element that is formed of plastic and mechanically fixes the component to the printed circuit board, wherein the at least one fixing element has a shaft which extends in an axial direction and at least one latch element on the shaft, comprising:

providing the printed circuit board having at least one contact bore and having at least one capturing bore, wherein the at least one capturing bore at least has a diameter which is larger than a cross section of the fixing element, so that the shaft of the fixing element while extending in the axial direction perpendicular to the printed circuit board can be inserted into the at least one capturing bore without force;

arranging the component on the printed circuit board with the electrical connection elements in the at least one contact bore and the shaft of the fixing element of the component while extending in the axial direction perpendicular to the printed circuit board in the at least one capturing bore of the printed circuit board without force, so that the shaft of the fixing element is positioned in the at least one capturing bore and the at least one latch element on the shaft extends completely through the at least one capturing bore;

filling, while the shaft of the fixing element remains extending in the axial direction perpendicular to the printed circuit board and the at least one latch element on the shaft extends completely through the at least one capturing bore such that the at least one latch element is located completely below the surface of the printed circuit board, the at least one contact bore the liquid soldering material, or melting and solidifying a soldering material which is already located in the at least one contact bore and the at least one capturing bore, wherein the soldering material being solidified surrounds at least a portion of the fixing element within the at least one capturing bore to provide a mechanical connection of the fixing element to the printed circuit board, wherein the at least one latch element in combination with the solidified soldering material resisting subsequent movement of the shaft in the axial direction.

4. The method as claimed in claim 3, comprising arranging at least one positioning device having at least one holding element, which can be releasably connected to the component, and at least one support on the printed circuit board or an adjacent printed circuit board, wherein the at least one positioning device holds the component by via the holding element and is releasably supported on the printed circuit board by way of the support, and removing the positioning device after the soldering material has solidified.

5. The method as claimed in claim 4, wherein the at least one holding element at least partially encompasses a contact element or a supporting element which is located on the component and/or engages into the contact element.

6. The method as claimed in claim 3, comprising arranging the component having at least one additional supporting element on the printed circuit board, the supporting element being releasably connected to the component, wherein the supporting element supports the component on the printed circuit board or an adjacent printed circuit board.

7. The method as claimed in claim 6, wherein the at least one additional supporting element is removed from the component after the soldering material has solidified.

8. A method for fastening, by soldering, a component having electrical connection elements for making contact with a printed circuit board and at least one fixing element for mechanically fixing the component to the printed circuit board, wherein the at least one fixing element has a shaft which extends in an axial direction and at least one latch element on the shaft, comprising:

providing the printed circuit board having at least one contact bore and having at least one capturing bore, wherein the at least one capturing bore at least has a diameter which is larger than an outermost cross section of the fixing element, so that the shaft of the fixing element while extending in the axial direction perpendicular to the printed circuit board can be inserted into the at least one capturing bore without force;

arranging the component on the printed circuit board with the electrical connection elements in the at least one contact bore and the shaft of the fixing element of the component while extending in the axial direction perpendicular to the printed circuit board in the at least one capturing bore of the printed circuit board without force, so that the shaft of the fixing element is positioned in the capturing bore and the at least one latch element on the shaft extends completely through the at least one capturing bore, the component having at least one additional supporting element on the printed circuit board, the supporting element being releasably connected to the component, wherein the supporting element supports the component on the printed circuit board or an adjacent printed circuit board;

filling, while the shaft of the fixing element remains extending in the axial direction perpendicular to the printed circuit board and the at least one latch element on the shaft extends completely through the at least one capturing bore such that the at least one latch element is located completely below the surface of the printed circuit board, the at least one contact bore the liquid soldering material; or melting and solidifying a soldering material which is already located in the at least one contact bore and the at least one capturing bore; wherein the soldering material being solidified surrounds at least a portion of the fixing element within the at least one capturing bore to provide a mechanical connection of the fixing element to the printed circuit board, the at least one latch element in combination with the solidified soldering material resisting subsequent movement of the shaft in the axial direction; and removing the at least one additional supporting element from the component after the soldering material has solidified.

9. The method as claimed in claim 1, wherein the at least one latch element engages the soldering material.

10. The method as claimed in claim 8, wherein the at least one latch element engages the soldering material.

\* \* \* \* \*